United States Patent
Koumura

(10) Patent No.: US 12,118,286 B2
(45) Date of Patent: Oct. 15, 2024

(54) WIRING LAYOUT DESIGN METHOD, PROGRAM, AND RECORDING MEDIUM

(71) Applicant: SEMICONDUCTOR ENERGY LABORATORY CO., LTD., Atsugi (JP)

(72) Inventor: Yusuke Koumura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 505 days.

(21) Appl. No.: 17/438,551

(22) PCT Filed: Mar. 9, 2020

(86) PCT No.: PCT/IB2020/052002
§ 371 (c)(1),
(2) Date: Sep. 13, 2021

(87) PCT Pub. No.: WO2020/188397
PCT Pub. Date: Sep. 24, 2020

(65) Prior Publication Data
US 2022/0147682 A1    May 12, 2022

(30) Foreign Application Priority Data

Mar. 20, 2019  (JP) ................................ 2019-052490

(51) Int. Cl.
*G06F 30/392*   (2020.01)
*G06N 3/04*     (2023.01)
(Continued)

(52) U.S. Cl.
CPC ............. *G06F 30/392* (2020.01); *G06N 3/04* (2013.01); *G06N 3/08* (2013.01); *G06N 20/00* (2019.01)

(58) Field of Classification Search
CPC ...... G06F 30/392; G06F 30/27; G06F 30/394; G06F 30/398; G06N 3/04; G06N 3/08;
(Continued)

(56) References Cited

U.S. PATENT DOCUMENTS 5,602,753 A     2/1997  Fukui
9,792,397 B1 *  10/2017 Nagaraja ................. G06F 30/32
(Continued)

FOREIGN PATENT DOCUMENTS

JP    08-006980 A    1/1996
JP    2003-050835 A  2/2003
(Continued)

OTHER PUBLICATIONS

International Search Report (Application No. PCT/IB2020/052002) Dated Jun. 23, 2020.
(Continued)

*Primary Examiner* — Nha T Nguyen
(74) *Attorney, Agent, or Firm* — Fish & Richardson P.C.

(57) ABSTRACT

A novel wiring layout design method is provided. A wiring layout in which a starting terminal group and an end terminal group are electrically connected to each other is generated using layout information and a netlist. In the case where the wiring layout satisfies a design rule, a wiring resistance and a parasitic capacitance of the wiring layout are extracted. The layout information is updated using Q learning and a new wiring layout is generated. In the Q learning, a positive reward is given when the values of the wiring resistance and the parasitic capacitance decrease, and a weight of the neural network is updated in accordance with the reward. In the case where the new wiring layout satisfies the design rule, a wiring resistance and a parasitic capacitance of the new wiring layout are extracted. In the case where the change
(Continued)

130: Control portion
140: Arithmetic portion
150: AI
160: Memory portion
170: Auxiliary memory portion
180: External input and output portion
190: Communication portion rate of the wiring resistance and the parasitic capacitance is high, the layout information is updated using the Q learning.

8 Claims, 8 Drawing Sheets

(51) Int. Cl.
  *G06N 3/08* (2023.01)
  *G06N 20/00* (2019.01)
(58) Field of Classification Search
  CPC ........ G06N 20/00; G06N 3/045; G06N 3/048;
          G06N 3/063; G06N 3/006; G06N 7/01;
          G06N 3/02; H01L 21/82
  See application file for complete search history.

(56) References Cited

U.S. PATENT DOCUMENTS

| | | | | |
|---|---|---|---|---|
| 10,437,954 B1 * | 10/2019 | White | ................... | G06F 30/392 |
| 10,755,026 B1 * | 8/2020 | Luo | ........................ | G06N 3/045 |
| 10,949,595 B2 | 3/2021 | Tsutsui et al. | | |
| 11,386,322 B1 * | 7/2022 | Ding | ..................... | G06F 30/394 |
| 2016/0343452 A1 | 11/2016 | Ikeda et al. | | |
| 2018/0300442 A1 * | 10/2018 | Izumi | ................... | G06F 30/398 |
| 2018/0307790 A1 * | 10/2018 | Chuang | .................. | G06N 3/08 |
| 2020/0104457 A1 * | 4/2020 | Chuang | ................. | G06F 30/392 |

FOREIGN PATENT DOCUMENTS

| | | | |
|---|---|---|---|
| JP | 2003-308351 A | 10/2003 | |
| JP | 2005-129869 A | 5/2005 | |
| JP | 2015-148926 A | 8/2015 | |
| WO | WO-2020/165688 | 8/2020 | |

OTHER PUBLICATIONS

Written Opinion (Application No. PCT/IB2020/052002) Dated Jun. 23, 2020.
Wang.H et al., "Learning to Design Circuits", NIPS 2018 Workshop on Machine Learning for Systems, Dec. 8, 2018, pp. 1-7.

* cited by examiner

130: Control portion
140: Arithmetic portion
150: AI
160: Memory portion
170: Auxiliary memory portion
180: External input and output portion
190: Communication portion

WIRING LAYOUT DESIGN METHOD, PROGRAM, AND RECORDING MEDIUM

CROSS REFERENCE TO RELATED APPLICATIONS

This application is a U.S. National Phase Application under 35 U.S.C. § 371 of International Application PCT/IB2020/052002, filed on Mar. 9, 2020, which is incorporated by reference and claims the benefit of a foreign priority application filed in Japan on Mar. 20, 2019, as Application No. 2019-052490.

TECHNICAL FIELD

One embodiment of the present invention relates to a wiring layout design method, a program, a recording medium, and the like.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. A transistor and a semiconductor circuit are embodiments of semiconductor devices. In some cases, it can be said that a display device (a liquid crystal display device, a light-emitting display device, and the like), a projection device, a lighting device, an electro-optical device, a power storage device, a memory device, an imaging device, an electronic device, and the like are semiconductor devices. Alternatively, it can be said that they include a semiconductor device in some cases.

BACKGROUND ART

In recent years, demand for miniaturization, high integration, and the like of an integrated circuit has risen. In general, an integrated circuit is composed of a plurality of circuits. The circuits are electrically connected to each other through wirings, and transmit and receive signals through the wirings. With miniaturization, high integration, and the like of an integrated circuit, parasitic capacitance between wirings and wiring resistance are required to be reduced. For example, Patent Document 1 proposes a wiring layout design method that achieves parasitic capacitance and wiring resistance each lower than or equal to an allowable value.

In addition, use of artificial intelligence is under consideration for various applications. Specifically, the use of the configuration of an artificial neural network is expected to enable obtaining computers with higher performance than conventional von Neumann computers, and in recent years, a variety of researches for building artificial neural networks in electronic circuits have been carried out.

For example, Patent Document 2 discloses an invention in which weight data necessary for calculation with an artificial neural network is retained in a memory device using a transistor including an oxide semiconductor in its channel formation region.

REFERENCE

Patent Document

[Patent Document 1] Japanese Published Patent Application No. 2003-50835
[Patent Document 2] United States Patent Application Publication No. 2016/0343452

SUMMARY OF THE INVENTION

Problems to be Solved by the Invention

Parasitic capacitance generated between wirings and wiring resistance cause a degradation or attenuation of waveforms of signals propagating the wirings. Thus, the parasitic capacitance and the wiring resistance need to be reduced as much as possible. Meanwhile, a layout that reduces the parasitic capacitance and the wiring resistance needs to satisfy a design rule. In the method of Patent Document 1, the layout design terminates at the time when the parasitic capacitance and the wiring resistance each become lower than or equal to an allowable value, and thus an optimized wiring layout cannot be obtained in some cases. In addition, the allowable values of the parasitic capacitance and the wiring resistance are sometimes set higher to satisfy the design rule.

An object of one embodiment of the present invention is to provide a design system of a wiring layout that satisfies a design rule and reduces the wiring resistance and the parasitic capacitance. Another object of one embodiment of the present invention is to provide a design method of a wiring layout that satisfies a design rule and reduces the wiring resistance and the parasitic capacitance. Another object of one embodiment of the present invention is to provide a novel wiring layout design system. Another object of one embodiment of the present invention is to provide a novel wiring layout design method.

Note that the descriptions of these objects do not preclude the existence of other objects. One embodiment of the present invention does not have to achieve all these objects. Note that objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention is a wiring layout design method including a first step in which first layout information is obtained; a second step in which a first wiring layout is generated using the first layout information; a third step in which a first parasitic capacitance value that is a parasitic capacitance value of the first wiring layout is obtained; a fourth step in which a second wiring layout is generated using the first layout information; a fifth step in which DRC is performed on the second wiring layout; a sixth step in which a second parasitic capacitance value that is a parasitic capacitance value of the second wiring layout is obtained; a seventh step in which learning is performed using a result of the DRC, the first parasitic capacitance value, and the second parasitic capacitance value; and an eighth step in which the first layout information is changed on the basis of a result of the learning.

Another embodiment of the present invention is a wiring layout design method including a first step in which first layout information is obtained; a second step in which a first wiring layout is generated using the first layout information; a third step in which a first parasitic capacitance value that is a parasitic capacitance value of the first wiring layout and a first wiring resistance value that is a wiring resistance value of the first wiring layout are obtained; a fourth step in which a second wiring layout is generated using the first layout information; a fifth step in which DRC is performed on the second wiring layout; a sixth step in which a second parasitic capacitance value that is a parasitic capacitance value of the second wiring layout and a second wiring resistance value that is a wiring resistance value of the second wiring layout are obtained; a seventh step in which learning is performed using a result of the DRC, the first parasitic capacitance value, the second parasitic capacitance value, the first wiring resistance value, and the second wiring resistance value; and an eighth step in which the first layout information is changed on the basis of a result of the learning.

Another embodiment of the present invention is the wiring layout design method in which the fourth step to the eighth step are repeated a plurality of times.

The learning is preferably performed using Q learning. The learning may be performed using a neural network. The neural network has a function of estimating an action value function.

Another embodiment of the present invention is a program for executing the wiring layout design method by a computer.

Another embodiment of the present invention is a computer-readable recording medium in which the program is recorded.

Effect of the Invention

According to one embodiment of the present invention, a design system of a wiring layout that satisfies a design rule and reduces the wiring resistance and the parasitic capacitance can be provided. According to another embodiment of the present invention, a design method of a wiring layout that satisfies a design rule and reduces the wiring resistance and the parasitic capacitance can be provided. According to another embodiment of the present invention, a novel wiring layout design system can be provided. According to another embodiment of the present invention, a novel wiring layout design method can be provided.

Note that the descriptions of the effects do not preclude the existence of other effects. One embodiment of the present invention does not have to have all these effects. Note that effects other than these will be apparent from the descriptions of the specification, the drawings, the claims, and the like and effects other than these can be derived from the descriptions of the specification, the drawings, the claims, and the like.

MODE FOR CARRYING OUT THE INVENTION

Figure 1:
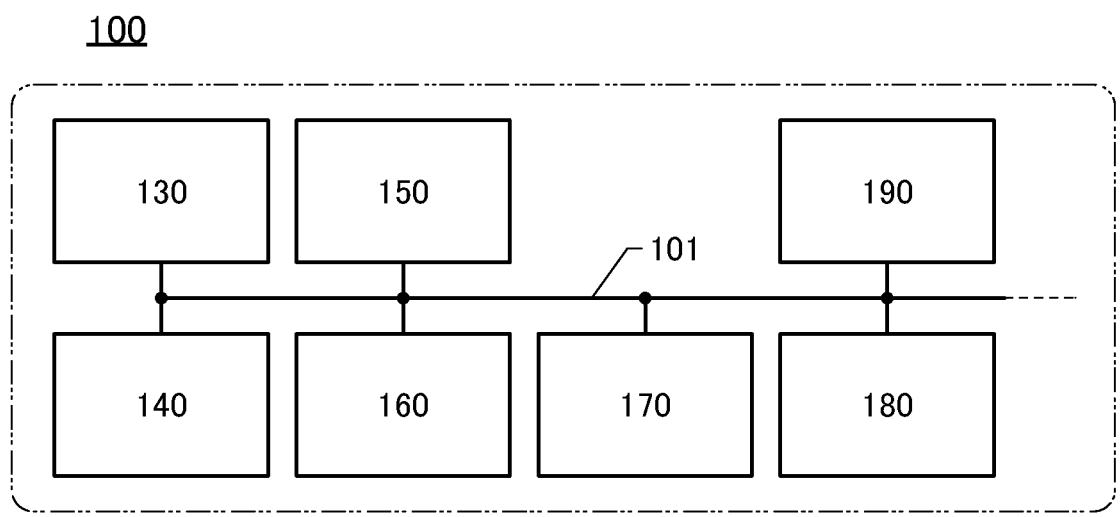
FIG. 1 is a diagram illustrating a configuration example of a wiring layout design system.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the present invention described below, the same portions or portions having similar functions are denoted by the same reference numerals in different drawings, and description thereof is not repeated.

The position, size, range, and the like of each component illustrated in the drawings and the like are not accurately represented in some cases for easy understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current or voltage and/or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±10% unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

A wiring layout design system (hereinafter, also referred to as "design system") of one embodiment of the present invention is described with reference to drawings.

<Configuration Example of Wiring Layout Design System>

FIG. 1 is a block diagram illustrating a configuration example of a design system 100.

Note that FIG. 1 illustrates the block diagram in which components are classified according to their functions and shown as independent blocks; however, it is difficult to separate actual components completely according to their functions in some cases. Thus, it is possible for one component to relate to a plurality of functions or a function to relate to a plurality of components.

The configuration of the design system 100 illustrated in FIG. 1 is an example, and not all the components need to be included. The design system 100 needs to include only necessary components among the components illustrated in FIG. 1. A component other than the components illustrated in FIG. 1 may be included.

The design system 100 includes, as its components, a control portion 130 (Controller), an arithmetic portion 140, a memory portion 160 (Memory), an auxiliary memory portion 170 (Storage), an external input and output portion 180 (Interface), and a communication portion 190. In addition, the design system 100 preferably includes AI 150 (AI: Artificial Intelligence).

These components are electrically connected to each other through a transmission path 101. Information can be transmitted and received between the components through the transmission path 101.

A transistor including an oxide semiconductor, which is a kind of metal oxide, in a channel formation region (such a transistor is also referred to as an "OS transistor") is preferably used as the transistor included in the above components. An OS transistor has an extremely low off-state current, and thus enables lower power consumption of the design system. In addition, an OS transistor operates stably with a smaller increase in the off-state current even in a high-temperature environment, and thus enables higher reliability of the design system 100.

Note that in this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is to say, in the case where a metal oxide has at least one of an amplifying function, a rectifying function, and a switching function, the metal oxide can be called a metal oxide semiconductor, or OS for short.

The metal oxide contained in the channel formation region preferably contains indium (In). When the metal oxide contained in the channel formation region is a metal oxide containing indium, the carrier mobility (electron mobility) of the OS transistor increases. The metal oxide contained in the channel formation region is preferably an oxide semiconductor containing an element M. The element M is preferably aluminum (Al), gallium (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that a plurality of the above elements may be used in combination as the element M in some cases. The element M is an element having high bonding energy with oxygen, for example. The element M is an element having higher bonding energy with oxygen than indium, for example. The metal oxide included in the channel formation region is preferably a metal oxide containing zinc (Zn). The metal oxide containing zinc is easily crystallized in some cases.

The metal oxide included in the channel formation region is not limited to a metal oxide containing indium. The semiconductor layer may be a metal oxide that does not contain indium and contains zinc, a metal oxide that contains gallium, a metal oxide that contains tin, or the like, e.g., a zinc tin oxide or a gallium tin oxide.

Note that an oxide semiconductor including a crystal portion, such as a CAAC-OS or an nc-OS, is preferably used for the semiconductor layer of the OS transistor. CAAC-OS is an abbreviation for c-axis-aligned crystalline oxide semiconductor. The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected. In addition, nc-OS is an abbreviation for nanocrystalline oxide semiconductor.

[Control Portion 130]

The control portion 130 (Controller) has a function of controlling operations of the arithmetic portion 140, the AI 150, the memory portion 160, the auxiliary memory portion 170, the external input and output portion 180, the communication portion 190, and the like.

[Arithmetic Portion 140]

The arithmetic portion 140 has a function of executing an arithmetic operation related to the operation of the whole design system, and a central processing unit (CPU) or the like can be used, for example.

The arithmetic portion 140 has a function of setting a wiring layout (a wiring shape, a wiring path, and the like) where a plurality of terminals are connected to each other in accordance with layout information.

[AI 150]

It is preferable to use an artificial neural network (ANN; hereinafter just referred to as neural network (NN)) for the AI 150. The AI 150 may be provided in the arithmetic portion 140. In addition, the AI 150 may be formed using software.

The control portion 130, the arithmetic portion 140, or the AI 150 may include a microprocessor such as a DSP (Digital Signal Processor) or a GPU (Graphics Processing Unit). The microprocessor may be constructed with a PLD (Programmable Logic Device) such as an FPGA (Field Programmable Gate Array) or an FPAA (Field Programmable Analog Array).

[Memory Portion 160]

The memory portion 160 is preferably a memory that has a function of storing programs and parameters related to the operation of the design system 100 and is rewritable at least partly. For example, the memory portion 160 can have a structure provided with a volatile memory such as a RAM (Random Access Memory) or a nonvolatile memory such as a ROM (Read Only Memory).

For example, a DRAM (Dynamic Random Access Memory) is used for the RAM provided in the memory portion 160, in which case a memory space as a workspace for the design system 100 is virtually allocated and used. An operating system, an application program, a program module, program data, and the like which are stored in the auxiliary memory portion 170 are loaded into the RAM to be executed.

Meanwhile, a BIOS (Basic Input/Output System), firmware, and the like for which rewriting is not needed can be stored in the ROM. As the ROM, a mask ROM, an OTPROM (One Time Programmable Read Only Memory), an EPROM (Erasable Programmable Read Only Memory), or the like can be used. Examples of the EPROM include a UV-EPROM (Ultra-Violet Erasable Programmable Read Only Memory) which can erase stored data by ultraviolet irradiation, an EEPROM (Electrically Erasable Programmable Read Only Memory), and a flash memory.

[Auxiliary Memory Portion 170]

The auxiliary memory portion 170 is a memory device for storing calculated data. Data to be used by the AI 150 are also stored, for example. Furthermore, as described above, the auxiliary memory portion 170 can store an operating system, an application program, a program module, program data, and the like.

As the auxiliary memory portion 170, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example. Furthermore, a memory media drive such as a hard disc drive (HDD) or a solid state drive (SSD) may be used, for example.

A memory device which can be connected and disconnected with the external input and output portion 180, such as an HDD or an SSD, or a media drive for a recording medium such as a flash memory, a Blu-ray disc, or a DVD can be used as auxiliary memory portion 170. Note that the auxiliary memory portion 170 is not incorporated in the design system 100, and a memory device located outside the design system 100 may be used as the auxiliary memory portion 170. In that case, the auxiliary memory portion 170 may be connected through the external input and output portion 180 or have a structure in which data transmission and reception may be wirelessly performed using the communication portion 190.

[External Input and Output Portion 180]

The external input and output portion 180 has a function of controlling input and output of a signal between an external device and the design system 100. As an external port included in the external input and output portion 180, an HDMI (registered trademark) terminal, a USB terminal, a terminal for LAN (Local Area Network) connection, or the like may be used. In addition, the external input and output portion 180 may have a transmission and reception function for optical communication using infrared rays, visible light, ultraviolet rays, and the like.

For example, layout data or the like generated in the design system 100 can be supplied to the outside through the external input and output portion 180.

[Communication Portion 190]

The communication portion 190 can perform communication via an antenna. For example, the communication portion 190 controls a control signal for connecting the design system 100 to a computer network in response to instructions from the arithmetic portion 140 and transmits the signal to the computer network. Accordingly, communication can be performed by connection of the design system 100 to a computer network such as the Internet, which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case where a plurality of communication methods are used, a plurality of antennas for the communication methods may be included.

The communication portion 190 is provided with a high frequency circuit (RF circuit), for example, to transmit and receive an RF signal. The high frequency circuit is a circuit for performing mutual conversion between an electromagnetic signal and an electric signal in a frequency band that is set by national laws to perform wireless communication with another communication apparatus using the electromagnetic signal. As a practical frequency band, several tens of kilohertz to several tens of gigahertz are generally used. A structure can be employed in which the high frequency circuit connected to an antenna includes a high frequency circuit portion compatible with a plurality of frequency bands and the high frequency circuit portion includes an amplifier, a mixer, a filter, a DSP (Digital Signal Processor), an RF transceiver, or the like. In the case of performing wireless communication, it is possible to use, as a communication protocol or a communication technology, a communication standard such as LTE (Long Term Evolution), GSM (Global System for Mobile Communication: registered trademark), EDGE (Enhanced Data Rates for GSM Evolution), CDMA 2000 (Code Division Multiple Access 2000), or WCDMA (Wideband Code Division Multiple Access: registered trademark), or a communication standard developed by IEEE such as Wi-Fi (registered trademark), Bluetooth (registered trademark), or ZigBee (registered trademark).

For example, a computer can function as the design system 100 of one embodiment of the present invention. In this case, a signal for starting the execution program of the design system 100 of one embodiment of the present invention is input through the external input and output portion 180 or the communication portion 190, and then the control portion 130 makes the memory portion 160 read the execution program stored in the auxiliary memory portion 170. By making the memory portion 160 read the execution program, the computer can function as the design system 100.

<Operation Example of Wiring Layout Design System>

Figure 2:
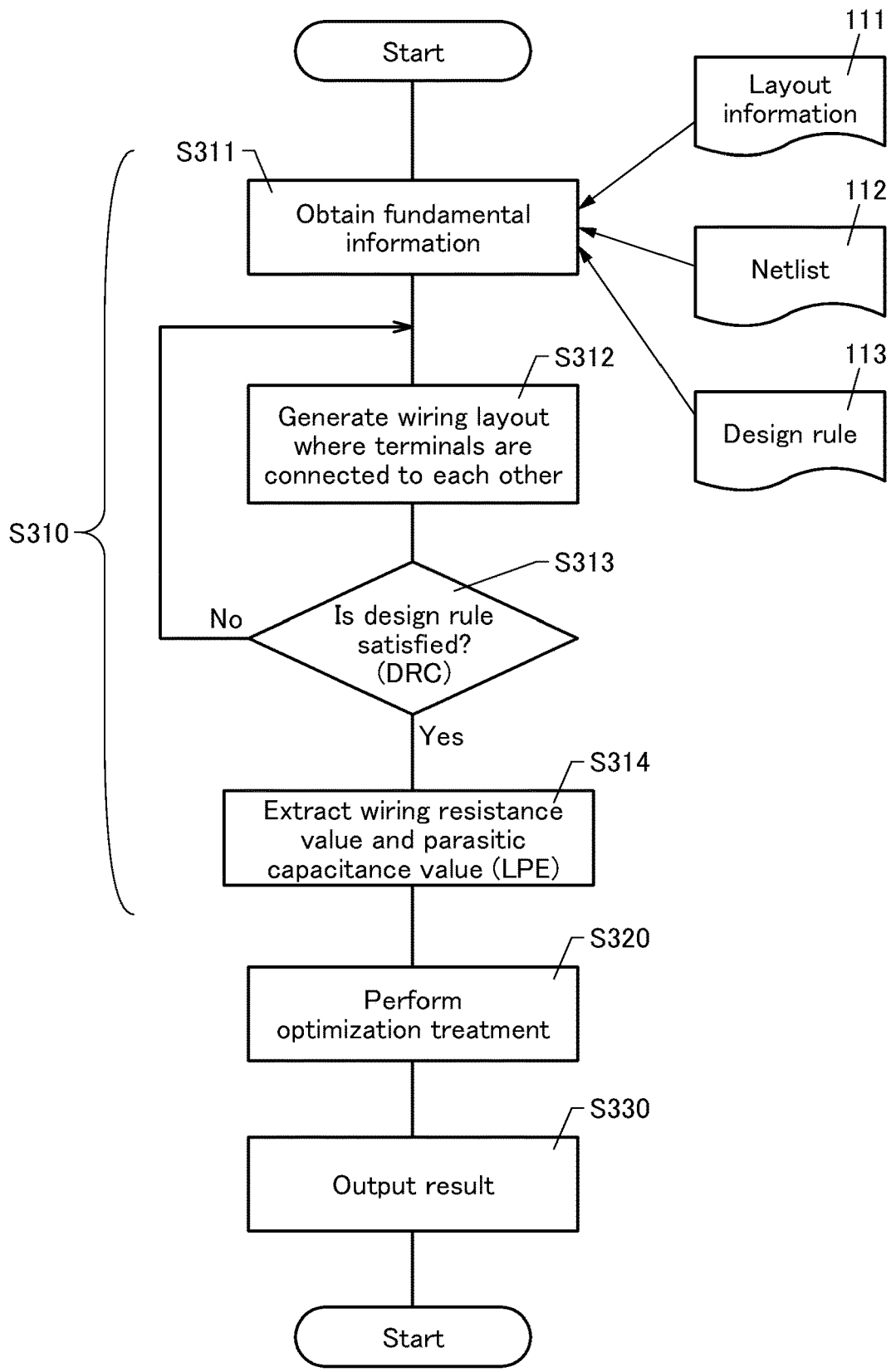
FIG. 2 is a diagram showing an example of a wiring layout design method.
Figure 3:
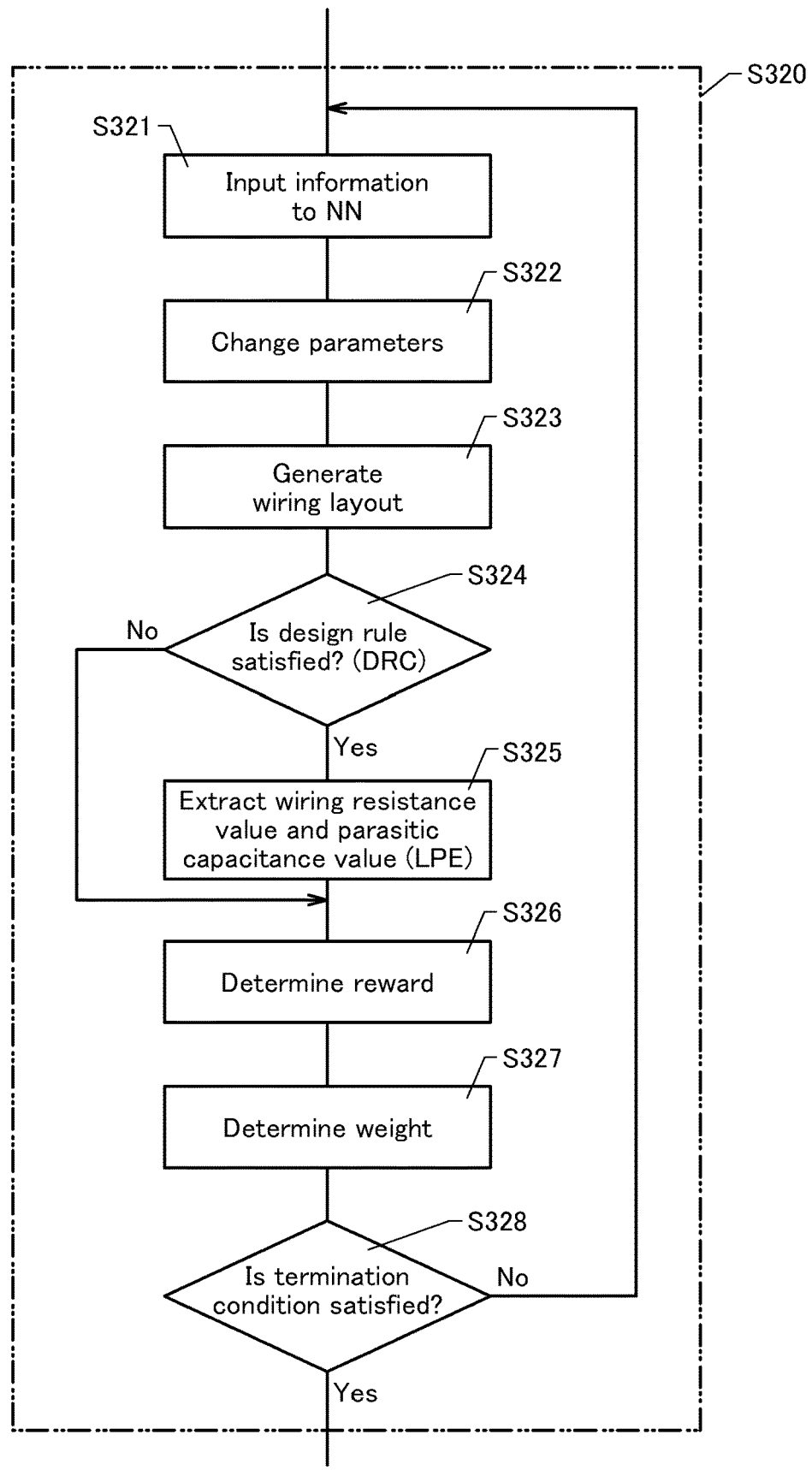
FIG. 3 is a diagram showing an example of a wiring layout design method.

Next, an operation example of the design system 100 will be described. In this embodiment, a design method of a wiring layout where a plurality of terminals are electrically connected to each other is described. FIG. 2 and FIG. 3 show a flow chart describing the design method of a wiring layout.

[Step S311]

First, fundamental information such as layout information 111, a netlist 112, and a design rule 113 is obtained. The layout information 111 includes information showing the arrangement of terminals. The netlist 112 includes information showing connection relationships between terminals (also referred to as "connection information"). The design rule 113 includes information showing the lower limits of a wiring width, a wiring interval, a connection diameter, and the like, the upper limit of the number of layers, prohibition rules, and the like.

The layout information 111, the netlist 112, the design rule 113, and the like may be information stored in the auxiliary memory portion 170 or may be information supplied to the design system 100 through the external input and output portion 180.

[Step S312]

Next, an initial wiring layout (a wiring shape, a wiring path, and the like) where terminals are electrically connected to each other is generated randomly. If the initial wiring layout is generated in accordance with a certain rule, the result of optimization treatment is biased in some cases. Therefore, the initial wiring layout is preferably generated randomly. The generated wiring layout is added to the layout information 111.

Note that in this specification and the like, in the case where two terminals are electrically connected to each other through a wiring, one of the terminals is referred to as a "starting terminal" and the other of the terminals is referred to as an "end terminal" in some cases.

Usually, a plurality of starting terminals and a plurality of end terminals exist. Thus, a plurality of wirings that electrically connect the starting terminals and the end terminals are also generated in many cases. In this specification and the like, the starting terminals are collectively referred to as a "starting terminal group" in some cases. Similarly, the end terminals are collectively referred to as an "end terminal group" in some cases. In addition, the plurality of wirings are collectively referred to as a "wiring group" in some cases.

The number of starting terminals is not necessarily the same as the number of end terminals. It is not necessary that one starting terminal be electrically connected to only one end terminal. For example, one starting terminal is electrically connected to a plurality of end terminals in some cases. Similarly, a plurality of starting terminals are electrically connected one end terminal in some cases. Which starting terminal is electrically connected to which end terminal is determined on the basis of the netlist 112.

[Step S313]

Next, whether the wiring layout of the wiring group, which has been generated randomly, satisfies the design rule 113 is checked. Checking whether the layout satisfies the design rule is referred to as DRC (Design Rule Check).

In the case where the layout does not satisfy the design rule 113, the operation returns to Step S312 and wirings are generated randomly.

[Step S314]

In the case where the wiring layout satisfies the design rule 113, layout parasitic extraction (LPE) is performed. The parasitic capacitance value extracted in Step S314 is the initial value of the optimization treatment to be performed subsequently. The wiring resistance value at this time is also the initial value of the optimization treatment to be performed subsequently.

Note that Step S311 to Step S314 can be collectively referred to as Step S310. Step S310 is a step in which initialization or pretreatment is performed.

The layout information obtained in Step S310 may be a netlist in which connection relationships between terminals are described in a hardware description language (HDL). Alternatively, the layout information may be a netlist in which connection relationships between terminals are described by SPICE (Simulation Program with Integrated Circuit Emphasis) or the like.

[Step S320]

Next, parameters are optimized using the AI 150. The parameters subjected to optimization include the wiring length, the wiring width, the distance between adjacent wirings, the number of portions where a wiring overlaps with another wiring, and the like. Step S320 is described in detail with reference to FIG. 3.

In optimizing the parameters, the layout information, the parasitic capacitance, and the wiring resistance obtained in Step S310 are used as the initial information. Within the range where the design rule 113 is satisfied, the parameters are optimized such that the parasitic capacitance and the wiring resistance are minimized.

The parameters can be optimized using reinforcement learning. "Reinforcement learning" is a kind of machine learning, and is a method different from "supervised learning" mainly used for image recognition and the like and "unsupervised learning" mainly used for clustering and the like. Reinforcement learning is a learning method in which a reward is given when a good result is obtained and a penalty is given when a bad result is obtained, and is mainly used in the case where the goal accomplishing means is difficult to control.

As reinforcement learning, TD learning (Temporal Difference Learning), Q learning, or the like can be employed, for example. It is particularly preferable that a learning algorithm using deep learning be employed in Q learning.

Q learning is a method in which the value of selection of an action $a_t$ by an agent at time t when the environment is in a state $s_t$ is learned. The agent means an agent that takes the action, and the environment means an object subject to the action. By the action $a_t$ by the agent, the environment makes a transition from a state $s_t$ to a state $s_{t+1}$ and the agent receives reward $r_{t+1}$. In Q learning, the action $a_t$ is learned such that the total amount of the obtained reward is peaked in the end. The value of taking the action $a_t$ in the state $s_t$ can be expressed as an action value function $Q(s_t,a_t)$. In this specification and the like, an action value function Q is referred to as a Q function and the value of the action value function $Q(s_t,a_t)$ is referred to as a Q value in some cases. For example, an update formula of the action value function $Q(s_t,a_t)$ can be expressed by Formula 1.

[Formula 1]

$$Q(s_t, a_t) \leftarrow Q(s_t, a_t) + \alpha\left[r_{t+1} + \gamma\max_a Q(s_{t+1}, a) - Q(s_t, a_t)\right] \quad (1)$$

Here, α represents a learning rate (α is greater than 0 and less than or equal to 1) and γ represents a discount rate (γ is greater than or equal to 0 and less than or equal to 1). The learning rate α means which of the present value and the result obtained by an action is emphasized. As the learning rate α becomes closer to 1, the obtained result is more emphasized and a change in the value becomes larger. As the learning rate α becomes closer to 0, the present value is more emphasized and a change in the value becomes smaller. The discount rate γ means which of the present reward and a future reward is emphasized. As the discount rate γ becomes closer to 0, the present reward is more emphasized. As the discount rate γ becomes closer to 1, a future reward is more emphasized. For example, the learning rate α can be 0.10 and the discount rate γ can be 0.90.

Deep learning can be used for estimation of the above-described action value function $Q(s_t,a_t)$. A learning algorithm which uses deep learning for estimation of the action value function $Q(s_t,a_t)$ is referred to as Deep Q-Learning and a neural network used for Deep Q-Learning is referred to as Deep Q-Network (DQN) in some cases.

It is particularly preferable that the layout design system of one embodiment of the present invention use Deep Q-Learning for optimization of parameters and the Deep Q-Network have a configuration of a convolutional neural network (CNN). Note that in this specification and the like, a Deep Q-Network is sometimes simply referred to as a neural network.

In general, in Q learning, data is stored in advance with a combination of the state $s_t$ and the action $a_t$ of the action value function $Q(s_t,a_t)$ which is in the form of a look-up table (LUT). However, there are a number of combinations of the state $s_t$ and the action $a_t$ and thus, a number of memories are necessary in some cases. In contrast, in the layout design system that is one embodiment of the present invention, the use of a neural network for estimation of the action value function $Q(s_t,a_t)$ can reduce the number of memories needed.

In this specification and the like, a neural network refers to a general model that is modeled on a biological neural network, determines the connection strength of neurons by learning, and has the capability of solving problems. A neural network includes an input layer, an output layer, and one or more intermediate layers (hidden layers) between the input layer and the output layer.

In the description of the neural network in this specification and the like, to determine a connection strength of neurons (also referred to as weight coefficient) from the existing information is referred to as "learning" in some cases.

Moreover, in this specification and the like, to draw a new conclusion from the neural network formed using the connection strength obtained by the learning is referred to as "inference" in some cases.

A neural network is executed by a huge number of product-sum operations. The use of one or both of a digital circuit and an analog circuit enables these operation processings. In the case where a digital circuit is used, a huge number of transistors are needed, resulting in inefficiency and high power consumption. Thus, the above product-sum operations are preferably performed by an analog product-sum operation circuit (hereinafter referred to as APS (Analog Product-Sum circuit)). The APS preferably includes an analog memory. The APS stores a weight coefficient obtained by learning, in the analog memory, whereby the APS can perform the product-sum operations using analog data as it is. Consequently, the APS enables a neural network to be formed efficiently with a small number of transistors.

Note that in this specification and the like, an analog memory refers to a memory device that can store analog data. In addition, analog data refers to data having a resolution of three bits (eight levels) or more in this specification. Multilevel data is referred to as analog data in some cases.

As the above analog memory, a multilevel flash memory, a ReRAM (Resistive Random Access Memory), an MRAM (Magnetoresistive Random Access Memory), or a memory using an OS transistor (also referred to as "OS memory") can be used.

[Step S321]

The layout information, the parasitic capacitance value, and the wiring resistance value determined in Step S310 are input to the AI 150.

[Step S322]

The AI 150 changes the parameter values in accordance with the values of the action value function $Q(s_t, a_t)$ and generates new layout information. For example, the operation of changing the parameters can be allocated as actions. The AI 150 selects actions that maximize the value of the action value function Q and changes the parameters. It is preferable that the actions be selected sometimes randomly.

[Step S323]

Using the new layout information, the arithmetic portion 140 sets a new wiring layout where the starting terminals and the end terminals are connected.

[Step S324]

Next, DRC is performed on the new wiring layout generated in Step S323. In the case where the new wiring layout does not satisfy the design rule, Step S325 is skipped and Step S326 is performed. In the case where the new wiring layout satisfies the design rule, Step S325 is performed.

[Step S325]

In the case where the new wiring layout satisfies the design rule, the values of the wiring resistance and the parasitic capacitance are extracted.

[Step S326]

Then, a reward to be given to the AI 150 is determined. In the case where the wiring layout does not satisfy the design rule in Step S324, a negative reward is given. Also in the case where the wiring resistance value increases or in the case where the parasitic capacitance value increases, a negative reward is given. In the case where the wiring resistance value decreases or in the case where the parasitic capacitance value decreases, a positive reward is given.

The reward value may be a constant value or may be determined in accordance with the increase/decrease amount of the wiring resistance value and/or the parasitic capacitance value.

The reward may be determined by a time constant τ. The time constant τ is the product of a wiring resistance value R and a parasitic capacitance value C. For example, a negative reward is given in the case where the time constant τ increases, and a positive reward is given in the case where the time constant τ decreases.

The negative reward of the case where the wiring layout does not satisfy the design rule is preferably greater than the negative reward of the case where the wiring resistance value, the parasitic capacitance value, or the time constant τ increases.

[Step S327]

Next, the AI 150 determines a new weight in accordance with the obtained reward.

[Step S328]

Then, whether the termination condition of the optimization treatment is satisfied is judged. The optimization treatment terminates, for example, in the case where the change rate of the wiring resistance value, the parasitic capacitance value, or the time constant τ becomes lower than or equal to a certain value and it is judged that no further decrease can be expected. In the case where it is judged that the termination condition is not satisfied, the operation returns to Step S321. In Step S321, the layout information and the like determined in Step S322 are input to the AI 150.

Alternatively, on the assumption that the change of the wiring resistance value, the parasitic capacitance value, or the time constant τ does not converge, the optimization treatment may terminate at the time when Step S320 is repeated a predetermined number of times or more.

[Step S330]

After the optimization treatment terminates, the generated layout information is stored in the auxiliary memory portion 170. The layout information is preferably stored in the GDS2 (Graphic Data System 2) format. The layout information may be supplied to the outside through the external input and output portion 180 or the communication portion 190.

According to one embodiment of the present invention, optimization operations can be repeated automatically, and thus an optimized wiring layout can be achieved in a short time. In addition, burden on a layout designer is reduced and work efficiency can be improved. Furthermore, the use of reinforcement learning, which is a kind of machine learning, for the optimization of a wiring layout enables finding a wiring layout that cannot be discovered by a person.

This embodiment can be combined with any of the other embodiments and the like as appropriate.

Embodiment 2

In this embodiment, a configuration example of the semiconductor device that can be used in the neural network described in the above embodiment is described.

Figure 4A:
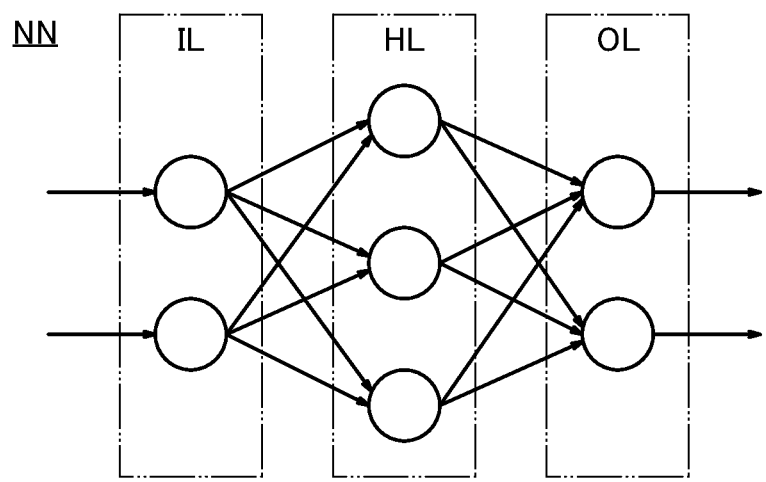
FIG. 4A and FIG. 4B are diagrams illustrating a configuration example of a neural network.

As illustrated in FIG. 4A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (a deep neural network), and learning using a deep neural network can also be referred to as deep learning.

Input data are input to the neurons of the input layer IL, output signals of the neurons in the previous layer or the subsequent layer are input to the neurons of the middle layer HL, and output signals of the neurons in the previous layer are input to the neurons of the output layer OL. Note that each neuron may be connected to all the neurons in the previous and subsequent layers (full connection), or may be connected to some of the neurons.

Figure 4B:
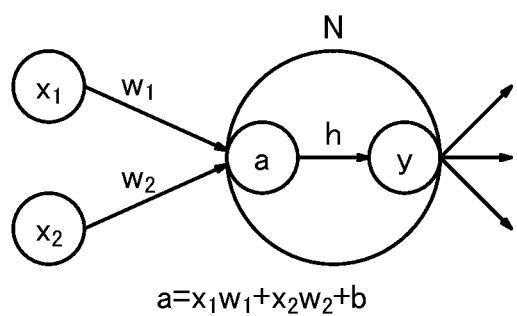

FIG. 4B illustrates an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=h(a) is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware. In the case where the product-sum operation is performed using hardware, a product-sum operation circuit can be used. As this product-sum operation circuit, a digital circuit may be used or an analog circuit may be used. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit may be formed of a transistor including silicon (such as single crystal silicon) in a channel formation region (hereinafter also referred to as a Si transistor) or may be formed of an OS transistor. An OS transistor is particularly preferably used as a transistor included in an analog memory of the product-sum operation circuit because of its extremely low off-state current. Note that the product-sum operation circuit may be formed using both a Si transistor and an OS transistor. A configuration example of a semiconductor device having a function of the product-sum operation circuit will be described below.

<Configuration Example of Semiconductor Device>

Figure 5:
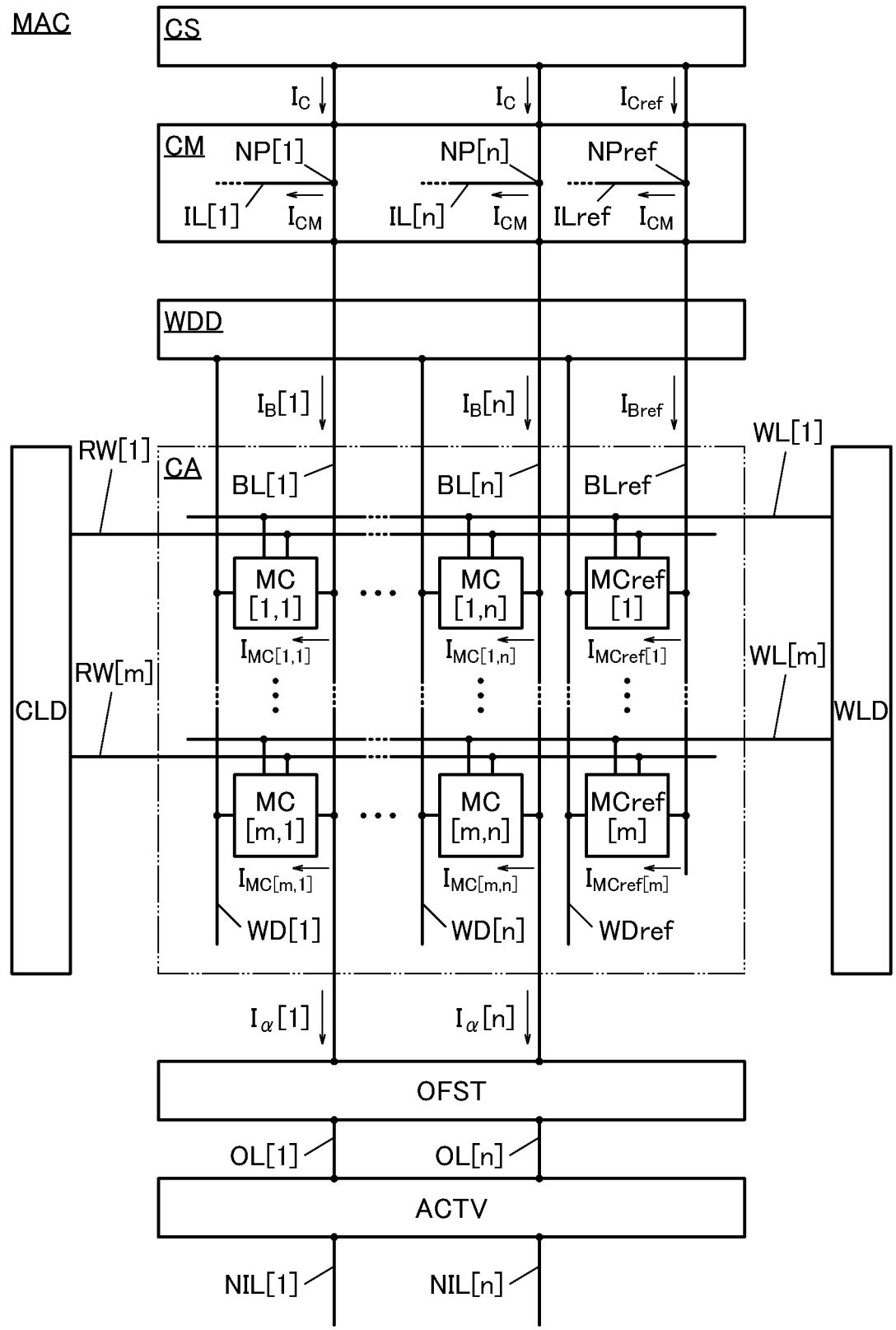
FIG. 5 is a diagram illustrating a structure example of a semiconductor device.

FIG. 5 illustrates a configuration example of a semiconductor device MAC having a function of performing an arithmetic operation of a neural network. The semiconductor device MAC has a function of performing a product-sum operation of first data corresponding to the connection strength (weight) between the neurons and second data corresponding to input data. Note that the first data and the second data can each be analog data or multilevel data (discrete data). The semiconductor device MAC also has a function of converting data obtained by the product-sum operation with the activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the configuration example illustrated in FIG. 5, the cell array CA includes the memory cells MC in m rows and n columns (memory cells MC[1, 1] to MC[m, n]) and the m memory cells MCref (memory cells MCref[1] to MCref[m]) (m and n are integers greater than or equal to 1). The memory cells MC have a function of storing the first data. In addition, the memory cells MCref have a function of storing reference data used for the product-sum operation. Note that the reference data can be analog data or multilevel data.

The memory cell MC[i,j] is connected to a wiring WL[i], a wiring RW[i], a wiring WD[j], and a wiring BL[j] (i is an integer greater than or equal to 1 and less than or equal to m, and j is an integer greater than or equal to 1 and less than or equal to n). In addition, the memory cell MCref[i] is connected to the wiring WL[i], the wiring RW[i], a wiring WDref, and a wiring BLref. Here, a current flowing between the memory cell MC[i,j] and the wiring BL[j] is denoted by $I_{MC[i,\ j]}$, and a current flowing between the memory cell MCref[i] and the wiring BLref is denoted by $I_{MCref[i]}$.

Figure 6:
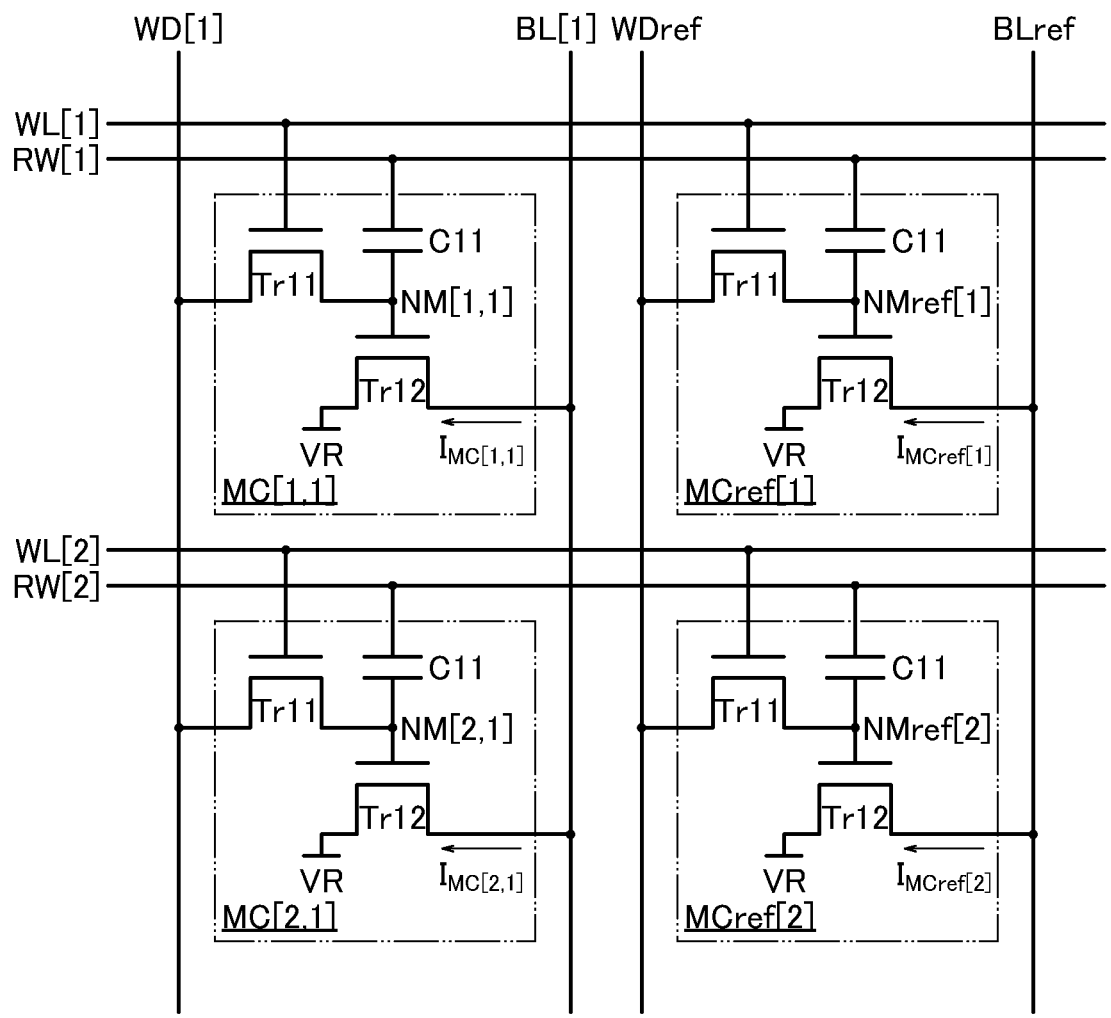
FIG. 6 is a diagram illustrating a configuration example of memory cells.

FIG. 6 illustrates a specific configuration example of the memory cells MC and the memory cells MCref. Although the memory cells MC[1, 1] and MC[2, 1] and the memory cells MCref[1] and MCref[2] are given as typical examples in FIG. 6, similar configurations can also be used for other memory cells MC and other memory cells MCref. The memory cells MC and the memory cells MCref each include transistors Tr11 and Tr12 and a capacitor C11. Here, the case where the transistor Tr11 and the transistor Tr12 are n-channel transistors will be described.

In the memory cell MC, a gate of the transistor Tr11 is connected to the wiring WL, one of a source and a drain of the transistor Tr11 is connected to a gate of the transistor Tr12 and a first electrode of the capacitor C11, and the other of the source and the drain is connected to the wiring WD. One of a source and a drain of the transistor Tr12 is connected to the wiring BL, and the other of the source and the drain is connected to a wiring VR. A second electrode of the capacitor C11 is connected to the wiring RW. The wiring VR is a wiring having a function of supplying a predetermined potential. Here, the case where a low power supply potential (e.g., a ground potential) is supplied from the wiring VR is described as an example.

Anode connected to the one of the source and the drain of the transistor Tr11, the gate of the transistor Tr12, and the first electrode of the capacitor C11 is referred to as a node NM. The nodes NM in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to the wiring BLref instead of the wiring BL. Each of a node NMref[1] in the memory cell MCref[1] and a node NMref[2] in the memory cell MCref[2] refers to a node connected to the one of the source and the drain of the transistor Tr11, the gate of the transistor Tr12, and the first electrode of the capacitor C11.

The node NM and the node NMref function as holding nodes of the memory cell MC and the memory cell MCref, respectively. The first data is held in the node NM and the reference data is held in the node NMref. Currents $I_{MC[1,\ 1]}$ and $I_{MC[2,\ 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 has a function of holding the potential of the node NM or the node NMref, the off-state current of the transistor Tr11 is preferably low. Thus, it is preferable to use an OS transistor, which has extremely low off-state current, as the transistor Tr11. This can suppress a change in the potential of the node NM or the node NMref, so that the arithmetic operation accuracy can be increased. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are respectively connected to the wirings BL[1] to BL[n], and the wiring ILref is connected to the wiring BLref. Here, a connection portion between the wirings IL[1] and BL[1] to a connection portion between the wirings IL[n] and BL[n] are referred to as nodes NP[1] to NP[n], respectively. Furthermore, a connection portion between the wiring ILref and the wiring BLref is referred to as a node NPref.

The current mirror circuit CM has a function of supplying a current $I_{CM}$ corresponding to the potential of the node NPref to the wiring ILref and a function of supplying this current $I_{CM}$ also to the wirings IL[1] to IL[n]. In the example illustrated in FIG. 5, the current $I_{CM}$ is discharged from the wiring BLref to the wiring ILref, and the current $I_{CM}$ is discharged from the wirings BL[1] to BL[n] to the wirings IL[1] to IL[n], respectively. Furthermore, currents flowing from the current mirror circuit CM to the cell array CA through the wirings BL[1] to BL[n] are denoted by $I_B[1]$ to $I_B[n]$, respectively. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD has a function of supplying a potential corresponding to the first data stored in the memory cells MC to the wirings WD[1] to WD[n]. The circuit WDD also has a function of supplying a potential corresponding to the reference data stored in the memory cell MCref to the wiring WDref. The circuit WLD is connected to wirings WL[1] to WL[m]. The circuit WLD has a function of supplying a signal for selecting the memory cell MC or MCref to which data is to be written, to any of the wirings WL[1] to WL[m]. The circuit CLD is connected to the wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of determining the amount of currents flowing from the wirings BL[1] to BL[n] to the offset circuit OFST and/or the amount of change in the currents flowing from the wirings BL[1] to BL[n] to the offset circuit OFST. The offset circuit OFST also has a function of outputting determination results to the wirings OL[1] to OL[n]. Note that the offset circuit OFST may output currents corresponding to the determination results to the wirings OL, or may convert the currents corresponding to the determination results into voltages to output the voltages to the wirings OL. The currents flowing between the cell array CA and the offset circuit OFST are denoted by $I_\alpha[1]$ to $I_\alpha[n]$.

Figure 7:
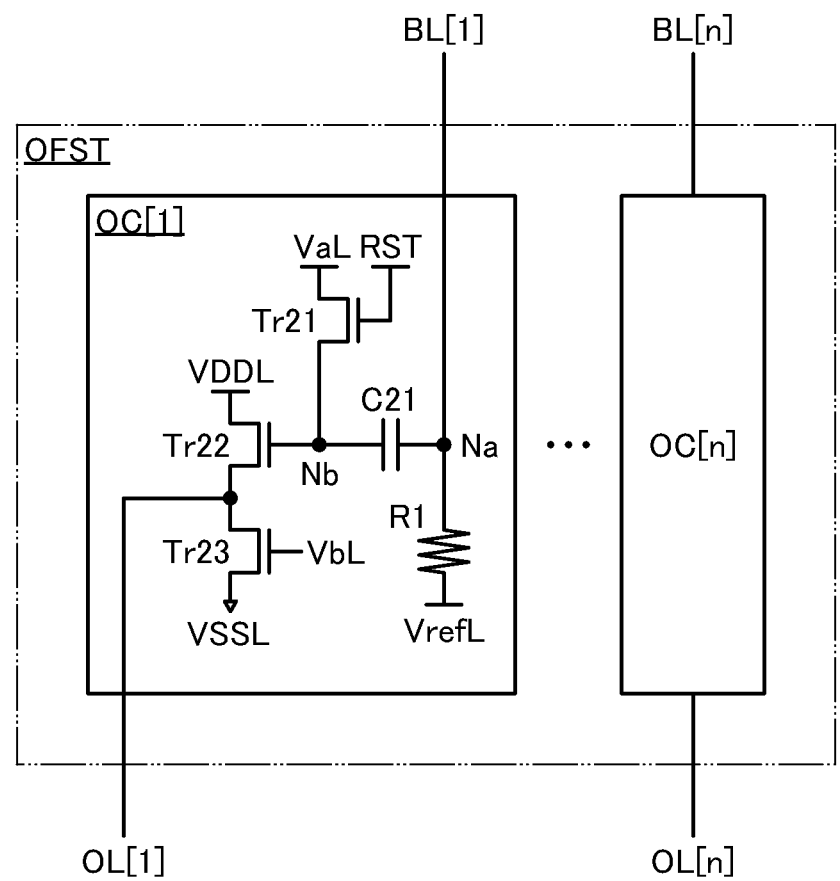
FIG. 7 is a diagram illustrating a configuration example of an offset circuit.

FIG. 7 illustrates a configuration example of the offset circuit OFST. The offset circuit OFST illustrated in FIG. 7 includes circuits OC[1] to OC[n]. The circuits OC[1] to OC[n] each include a transistor Tr21, a transistor Tr22, a transistor Tr23, a capacitor C21, and a resistor R1. Connection relationships of the elements are illustrated in FIG. 7. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power supply potential and the potential VSS is a low power supply potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] will be described. Note that although an operation example of the circuit OC[1] is described here as a typical example, the circuits OC[2] to OC[n] can be operated in a similar manner. First, when a first current flows to the wiring BL[1], the potential of the node Na becomes a potential corresponding to the first current and the resistance value of the resistor R1. At this time, the transistor Tr21 is in an on state, and thus the potential Va is supplied to the node Nb. Then, the transistor Tr21 is brought into an off state.

Next, when a second current flows to the wiring BL[1], the potential of the node Na becomes a potential corresponding to the second current and the resistance value of the resistor R1. At this time, since the transistor Tr21 is in an off state and the node Nb is in a floating state, the potential of the node Nb is changed owing to capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. In addition, when the threshold voltage of the transistor Tr22 is $V_{th}$, a potential of $Va+\Delta V_{Na}-V_{th}$ is output from the wiring OL[1]. Here, when $Va=V_{th}$, the potential $\Delta V_{Na}$ can be output from the wiring OL[1].

The potential $\Delta V_{Na}$ is determined by the amount of change from the first current to the second current, a resistance value of the resistor R1, and the potential Vref. Here, since the resistance value of the resistor R1 and the potential Vref are known, the amount of change in the current flowing to the wiring BL can be found from the potential $\Delta V_{Na}$.

A signal corresponding to the amount of current and/or the amount of change in the current that are/is determined by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an arithmetic operation for converting the signal input from the offset circuit OFST in accordance with the predefined activation function. As the activation function, for example, a sigmoid function, a tanh function, a softmax function, a ReLU function, a threshold function, or the like can be used. The signal converted by the activation function circuit ACTV is output as output data to the wirings NIL[1] to NIL[n].

<Operation Example of Semiconductor Device>

With the above semiconductor device MAC, the product-sum operation of the first data and the second data can be performed. An operation example of the semiconductor device MAC at the time of performing the product-sum operation will be described below.

Figure 8:
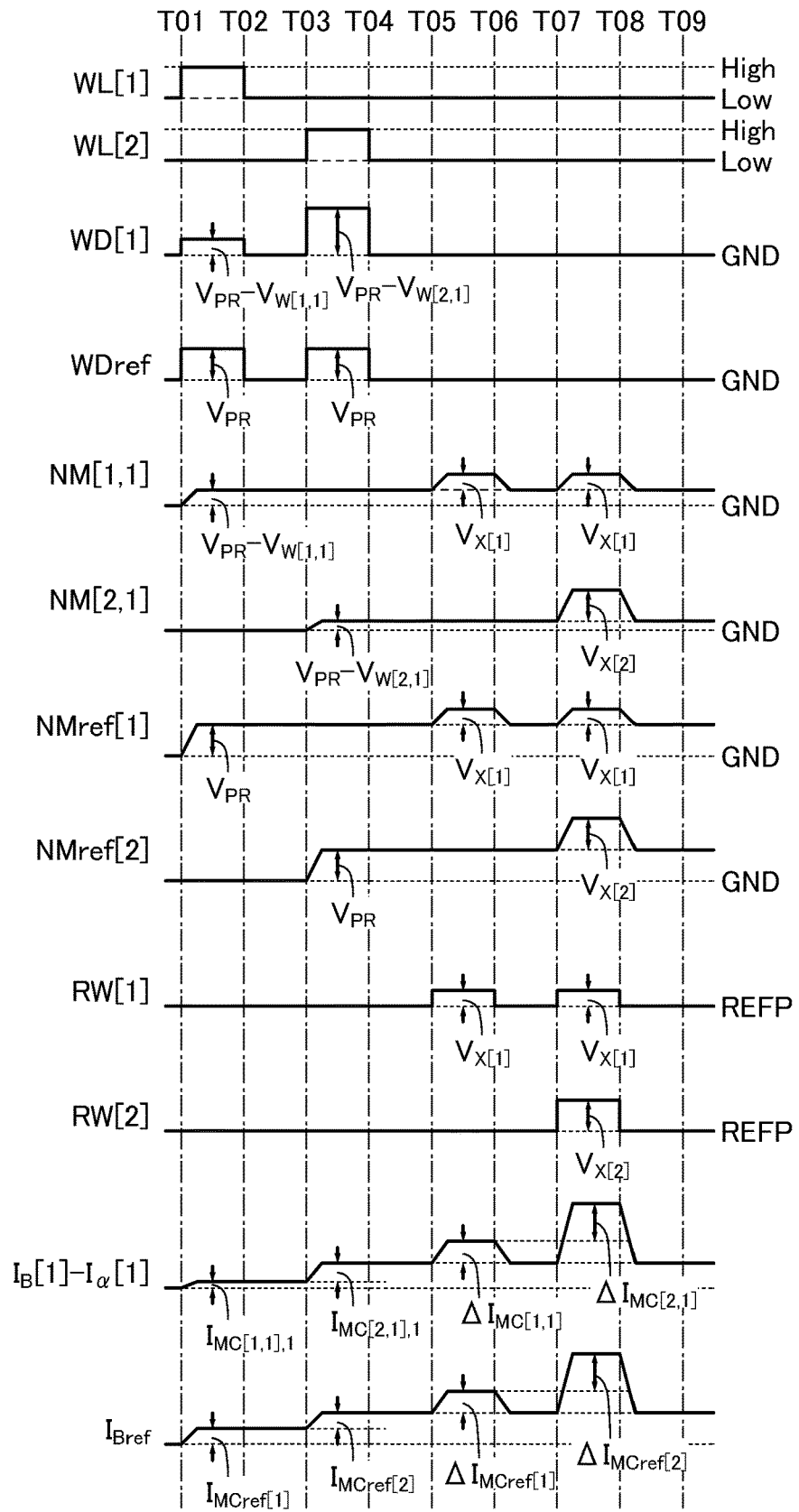
FIG. 8 is a timing chart.

FIG. 8 shows a timing chart of the operation example of the semiconductor device MAC. FIG. 8 shows changes in the potentials of the wiring WL[1], the wiring WL[2], the wiring WD[1], the wiring WDref, the node NM[1, 1], the node NM[2, 1], the node NMref[1], the node NMref[2], the wiring RW[1], and the wiring RW[2] in FIG. 6 and changes in the values of the currents $I_B[1]-I_\alpha[1]$ and $I_{Bref}$. The current $I_B[1]-I_\alpha[1]$ corresponds to the sum total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] illustrated in FIG. 6 as a typical example, the other memory cells MC and the other memory cells MCref can also be operated in a similar manner.

[Storage of First Data]

First, from Times T01 to T02, the potential of the wiring WL[1] becomes a high level (High), the potential of the wiring WD[1] becomes a potential greater than a ground potential (GND) by $V_{PR}-V_{W[1, 1]}$ and the potential of the wiring WDref becomes a potential greater than the ground potential by $V_{PR}$. The potentials of the wiring RW[1] and the wiring RW[2] are reference potentials (REFP). Note that the potential $V_{W[1, 1]}$ is the potential corresponding to the first data stored in the memory cell MC[1, 1]. The potential $V_{PR}$ is the potential corresponding to the reference data. Thus, the transistors Tr11 included in the memory cell MC[1, 1] and the memory cell MCref[1] are brought into an on state, and the potential of the node NM[1, 1] becomes $V_{PR}-V_{W[1, 1]}$ and the potential of the node NMref[1] becomes $V_{PR}$.

In this case, a current $I_{MC[1, 1]}$ flowing from the wiring BL[1] to the transistor Tr12 in the memory cell MC[1, 1] can be expressed by a formula shown below. Here, k is a constant determined by the channel length, the channel width, the mobility, the capacitance of a gate insulating film, and the like of the transistor Tr12. In addition, $V_{th}$ is the threshold voltage of the transistor Tr12.

$$I_{MC[1,1],0}=k(V_{PR}-V_{W[1,1]}-V_{th})^2 \quad (E1)$$

A current $I_{MCref[1], 0}$ flowing from the wiring BLref to the transistor Tr12 in the memory cell MCref[1] can be expressed by a formula shown below.

$$I_{MCref[1],0}=k(V_{PR}-V_{th})^2 \quad (E2)$$

Next, from Times T02 to T03, the potential of the wiring WL[1] becomes a low level (Low). Consequently, the transistors Tr11 included in the memory cell MC[1, 1] and the memory cell MCref[1] are brought into an off state, and the potentials of the node NM[1, 1] and the node NMref[1] are held.

As described above, an OS transistor is preferably used as the transistor Tr11. This can suppress the leakage current of the transistor Tr11, so that the potentials of the node NM[1, 1] and the node NMref[1] can be accurately held.

Next, from Times T03 to T04, the potential of the wiring WL[2] becomes a high level, the potential of the wiring WD[1] becomes a potential greater than the ground potential by $V_{PR}-V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cell MC[2, 1] and the memory cell MCref[2] are brought into an on state, and the potential of the node NM[2, 1] becomes $V_{PR}-V_{W[2, 1]}$ and the potential of the node NMref[2] becomes $V_{PR}$.

Here, a current $I_{MC[2, 1], 0}$ flowing from the wiring BL[1] to the transistor Tr12 in the memory cell MC[2, 1] can be expressed by a formula shown below.

$$I_{MC[2,1],0}=k(V_{PR}-V_{W[2,1]}-V_{th})^2 \quad (E3)$$

Furthermore, a current $I_{MCref[2], 0}$ flowing from the wiring BLref to the transistor Tr12 in the memory cell MCref[2] can be expressed by a formula shown below.

$$I_{MCref[2],0}=k(V_{PR}-V_{th})^2 \quad (E4)$$

Next, from Times T04 to T05, the potential of the wiring WL[2] becomes a low level. Consequently, the transistors Tr11 included in the memory cell MC[2, 1] and the memory cell MCref[2] are brought into an off state, and the potentials of the node NM[2, 1] and the node NMref[2] are held.

Through the above operation, the first data is stored in the memory cells MC[1, 1] and MC[2, 1], and the reference data is stored in the memory cells MCref[1] and MCref[2].

Here, currents flowing to the wiring BL[1] and the wiring BLref from Times T04 to T05 are considered. The current is supplied from the current source circuit CS to the wiring BLref. The current flowing through the wiring BLref is discharged to the current mirror circuit CM and the memory cells MCref[1] and MCref[2]. A formula shown below holds, where $I_{Cref}$ is the current supplied from the current source circuit CS to the wiring BLref and $I_{CM, 0}$ is the current discharged from the wiring BLref to the current mirror circuit CM.

$$I_{Cref}-I_{CM,0}=I_{MCref[1],0}+I_{MCref[2],0} \quad (E5)$$

The current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{C, 0}$ is the current supplied from the current source circuit CS to the wiring BL[1] and $I_{\alpha, 0}$ is the current flowing from the wiring BL[1] to the offset circuit OFST.

$$I_C-I_{CM,0}=I_{MC[1,1],0}+I_{MC[2,1],0}+I_{\alpha,0} \quad (E6)$$

[Product-Sum Operation of First Data and Second Data]

Next, from Times T05 to T06, the potential of the wiring RW[1] becomes a potential greater than the reference potential by $V_{X[1]}$. At this time, the potential $V_{X[1]}$ is supplied to the capacitors C11 in the memory cell MC[1, 1] and the memory cell MCref[1], so that the potentials of the gates of the transistors Tr12 increase owing to capacitive coupling. Note that the potential $V_{X[1]}$ is the potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is set to 1. In practice, the potential $V_X$ can be determined in consideration of the capacitive coupling coefficient.

When the potential $V_{X[1]}$ is supplied to the capacitors C11 in the memory cell MC[1,1] and the memory cell MCref[1], the potentials of the node NM[1,1] and the node NMref[1] each increase by $V_{X[1]}$.

Here, a current $I_{MC[1, 1], 1}$ flowing from the wiring BL[1] to the transistor Tr12 in the memory cell MC[1, 1] from Times T05 to T06 can be expressed by a formula shown below.

$$I_{MC[1,1],1} = k(V_{PR} - V_{W[1,1]} + V_{X[1]} - V_{th})^2 \quad (E7)$$

Thus, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1], 1} - I_{MC[1, 1], 0}$.

Here, a current $I_{MCref[1], 1}$ flowing from the wiring BLref to the transistor Tr12 in the memory cell MCref[1] from Times T05 to T06 can be expressed by a formula shown below.

$$I_{MCref[1],1} = k(V_{PR} + V_{X[1]} - V_{th})^2 \quad (E8)$$

Thus, when the potential $V_{X[1]}$ is supplied to the wiring RW[1], the current flowing from the wiring BLref to the transistor Tr12 in the memory cell MCref[1] increases by $\Delta I_{MCref[1]} = I_{MCref[1], 1} - I_{MCref[1], 0}$.

Furthermore, currents flowing to the wiring BL[1] and the wiring BLref are considered. A current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM, 1}$ is the current discharged from the wiring BLref to the current mirror circuit CM.

$$I_{Cref} - I_{CM,1} = I_{MCref[1],1} + I_{MCref[2],0} \quad (E9)$$

The current $I_C$ is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha, 1}$ is the current flowing from the wiring BL[1] to the offset circuit OF ST.

$$I_C - I_{CM,1} = I_{MC[1,1],1} + I_{MC[2,1],1} + I_{\alpha,1} \quad (E10)$$

In addition, from Formula (E1) to Formula (E10), a difference between the current $I_{\alpha, 0}$ and the current $I_{\alpha, 1}$ (differential current $\Delta I_\alpha$) can be expressed by a formula shown below.

$$\Delta I_\alpha = I_{\alpha,1} - I_{\alpha,0} = 2kV_{W[1,1]}V_{X[1]} \quad (E11)$$

Thus, the differential current $\Delta I_\alpha$ is a value corresponding to the product of the potentials $V_{W[1, 1]}$ and $V_{X[1]}$.

After that, from Times T06 to T07, the potential of the wiring RW[1] becomes the reference potential, and the potentials of the node NM[1, 1] and the node NMref[1] become similar to those from Times T04 to T05.

Next, from Times T07 to T08, the potential of the wiring RW[1] becomes a potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitors C11 in the memory cell MC[1, 1] and the memory cell MCref[1], and the potentials of the node NM[1, 1] and the node NMref[1] each increase by $V_{X[1]}$ owing to capacitive coupling. Furthermore, the potential $V_{X[2]}$ is supplied to the capacitors C11 in the memory cell MC[2, 1] and the memory cell MCref[2], and the potentials of the node NM[2, 1] and the node NMref[2] each increase by $V_{X[2]}$ owing to capacitive coupling.

Here, the current $I_{MC[2, 1], 1}$ flowing from the wiring BL[1] to the transistor Tr12 in the memory cell MC[2, 1] from Times T07 to T08 can be expressed by a formula shown below.

$$I_{MC[2,1],1} = k(V_{PR} - V_{W[2,1]} + V_{X[2]} - V_{th})^2 \quad (E12)$$

Thus, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1], 1} - I_{MC[2, 1], 0}$.

Here, a current $I_{MCref[2], 1}$ flowing from the wiring BLref to the transistor Tr12 in the memory cell MCref[2] from Times T07 to T08 can be expressed by a formula shown below.

$$I_{MCref[2],1} = k(V_{PR} + V_{X[2]} - V_{th})^2 \quad (E13)$$

Thus, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing to the wirings BL[1] and BLref are considered. The current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM, 2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha, 2}$ is the current flowing from the wiring BL[1] to the offset circuit OF ST.

$$I_C - I_{CM,2} = I_{MC[1,1],1} + I_{MC[2,1],1} + I_{\alpha,2} \quad (E15)$$

In addition, from Formula (E1) to Formula (E8) and Formula (E12) to Formula (E15), a difference between the current $I_{\alpha, 0}$ and the current $I_{\alpha, 2}$ (differential current $\Delta I_\alpha$) can be expressed by a formula shown below.

$$\Delta I_\alpha = I_{\alpha,2} - I_{\alpha,0} = 2k(V_{W[1,1]}V_{X[1]} + V_{W[2,1]}V_{X[2]}) \quad (E16)$$

Thus, the differential current $\Delta I_\alpha$ is a value corresponding to a result of the sum of the product of the potential $V_{W[1, 1]}$ and the potential $V_{X[1]}$ and the product of the potential $V_{W[2, 1]}$ and the potential $V_{X[2]}$.

After that, from Times T08 to T09, the potentials of the wirings RW[1] and RW[2] become the reference potential, and the potentials of the nodes NM[1, 1] and NM[2, 1] and the nodes NMref[1] and NMref[2] become similar to those from Times T04 to Time T05.

As represented by Formula (E11) and Formula (E16), the differential current $\Delta I_\alpha$ input to the offset circuit OFST can be calculated from the formula including a product term of the potential $V_W$ corresponding to the first data (weight) and the potential $V_X$ corresponding to the second data (input data). Thus, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are focused on in the above description, the number of memory cells MC and the memory cells MCref can be set freely. In the case where the number m of rows of the memory cells MC and the memory cells MCref is a given number i, the differential current $\Delta I_\alpha$ can be expressed by a formula shown below.

$$\Delta I_\alpha = 2k\Sigma_i V_{W[i,1]} V_X[i] \tag{E17}$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the configuration of the memory cell MC and the memory cell MCref in FIG. 6 allows the product-sum operation circuit to be formed using fewer transistors. Accordingly, the circuit scale of the semiconductor device MAC can be reduced.

In the case where the semiconductor device MAC is used for the arithmetic operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL illustrated in FIG. 4A is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the configuration of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), and the like.

The product-sum operation of the neural network can be performed using the semiconductor device MAC as described above. Furthermore, when the memory cells MC and the memory cells MCref illustrated in FIG. 6 are used for the cell array CA, it is possible to provide an integrated circuit IC with improved arithmetic operation accuracy, lower power consumption, or a reduced circuit scale.

This embodiment can be combined with any of the other embodiments as appropriate.

REFERENCE NUMERALS

100: design system, 101: transmission path, 111: layout information, 112: netlist, 113: design rule, 130: control portion, 140: arithmetic portion, 150: AI, 160: memory portion, 170: auxiliary memory portion, 180: external input and output portion, 190: communication portion

The invention claimed is:

1. A wiring layout design method comprising:
a first step of obtaining first layout information, a netlist, and a design rule;
a second step of generating a first wiring layout using the first layout information;
a third step of obtaining a first parasitic capacitance value that is a parasitic capacitance value of the first wiring layout;
a fourth step of generating a second wiring layout using the first layout information;
a fifth step of checking whether the second wiring layout satisfies the design rule;
a sixth step of obtaining a second parasitic capacitance value that is a parasitic capacitance value of the second wiring layout;
a seventh step of performing learning using a result of the fifth step, the first parasitic capacitance value, and the second parasitic capacitance value; and
an eighth step of changing the first layout information on the basis of a result of the learning,
wherein the first layout information comprises information about an arrangement of terminals,
wherein the netlist comprises information about connection relationships between the terminals, and
wherein the design rule comprises information about lower limits of at least one of a wiring width, a wiring interval, and a connection diameter.

2. The wiring layout design method according to claim 1, wherein the learning is Q learning.

3. The wiring layout design method according to claim 1, wherein the learning is performed using a neural network.

4. The wiring layout design method according to claim 3, wherein the neural network estimates an action value function.

5. A wiring layout design method comprising:
a first step of obtaining first layout information;
a second step of randomly generating a first wiring layout comprising one of a wiring shape and a wiring path using the first layout information;
a third step of obtaining a first parasitic capacitance value that is a parasitic capacitance value of the first wiring layout and a first wiring resistance value that is a wiring resistance value of the first wiring layout;
a fourth step of generating a second wiring layout using the first layout information;
a fifth step of checking whether the second wiring layout satisfies a design rule;
a sixth step of obtaining a second parasitic capacitance value that is a parasitic capacitance value of the second wiring layout and a second wiring resistance value that is a wiring resistance value of the second wiring layout;
a seventh step of performing learning using artificial intelligence based on a result of the fifth step, the first parasitic capacitance value, the second parasitic capacitance value, the first wiring resistance value, and the second wiring resistance value; and
an eighth step of optimizing parameters of the first layout information on the basis of a result of the learning,
wherein the optimized parameters comprise at least one of a wiring length, a wiring width, a distance between a first wiring and a second wiring which is adjacent to the first wiring, and the number of portions where a third wiring overlaps with a fourth wiring.

6. The wiring layout design method according to claim 5, wherein the learning is Q learning.

7. The wiring layout design method according to claim 5, wherein the learning is performed using a neural network.

8. The wiring layout design method according to claim 7 wherein the neural network estimates an action value function.

* * * * *